(12) United States Patent
Singh et al.

(10) Patent No.: US 10,818,821 B2
(45) Date of Patent: *Oct. 27, 2020

(54) LIGHT EXTRACTION USING FEATURE SIZE AND SHAPE CONTROL IN LED SURFACE ROUGHENING

(71) Applicant: LUMILEDS LLC, San Jose, CA (US)

(72) Inventors: Rajwinder Singh, Pleasanton, CA (US); John Edward Epler, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/150,917

(22) Filed: Oct. 3, 2018

(65) Prior Publication Data

US 2019/0035976 A1    Jan. 31, 2019

Related U.S. Application Data

(60) Continuation of application No. 15/216,444, filed on Jul. 21, 2016, now Pat. No. 10,121,937, which is a
(Continued)

(51) Int. Cl.
*H01L 33/22* (2010.01)
*H01L 33/00* (2010.01)
(Continued)

(52) U.S. Cl.
CPC .......... *H01L 33/22* (2013.01); *H01L 33/0025* (2013.01); *H01L 33/0075* (2013.01);
(Continued)

(58) Field of Classification Search
None
See application file for complete search history.

(56) References Cited

U.S. PATENT DOCUMENTS

| 5,779,924 A | 7/1998 | Krames et al. |
| 7,227,879 B2 | 6/2007 | Matsumura et al. |

(Continued)

FOREIGN PATENT DOCUMENTS

| CN | 101335314 | 12/2008 |
| CN | 102214759 | 10/2011 |

(Continued)

OTHER PUBLICATIONS

G. B. Stringfellow, "Organometallic Vapor-Phase Epitaxy, Second Edition: Theory and Practice", pp. 406-413, 452-459 (Dec. 23, 1998).

(Continued)

*Primary Examiner* — Mounir S Amer
(74) *Attorney, Agent, or Firm* — Volpe and Koenig, P.C.

(57) ABSTRACT

The structural characteristics of the light-exiting surface of a light emitting device are controlled so as to increase the light extraction efficiency of that surface when the surface is roughened. A light emitting surface comprising layers of materials with different durability to the roughening process exhibits a higher light extraction efficiency than a substantially uniform light emitting surface exposed to the same roughening process. In a GaN-type light emitting device, a thin layer of AlGaN material on or near the light-exiting surface creates sharper features after etching compared to the features created by conventional etching of a surface comprising only GaN material.

10 Claims, 3 Drawing Sheets

Related U.S. Application Data division of application No. 14/402,362, filed as application No. PCT/IB2013/054224 on May 22, 2013, now Pat. No. 9,559,258.

(60) Provisional application No. 61/654,112, filed on Jun. 1, 2012.

(51) Int. Cl.

| | | |
|---|---|---|
| *H01L 33/58* | (2010.01) | |
| *H01L 33/32* | (2010.01) | |
| *H01L 33/10* | (2010.01) | |
| *H01L 33/40* | (2010.01) | |
| *H01L 33/60* | (2010.01) | |
| *H01L 33/30* | (2010.01) | |

(52) U.S. Cl.
CPC ...... *H01L 33/0093* (2020.05); *H01L 33/0095* (2013.01); *H01L 33/10* (2013.01); *H01L 33/30* (2013.01); *H01L 33/32* (2013.01); *H01L 33/405* (2013.01); *H01L 33/58* (2013.01); *H01L 33/60* (2013.01); *H01L 2933/0033* (2013.01); *H01L 2933/0058* (2013.01)

(56) References Cited

U.S. PATENT DOCUMENTS

| | | |
|---|---|---|
| 7,335,920 B2 | 2/2008 | Denbaars et al. |
| 7,442,644 B2 | 10/2008 | Nogami |
| 7,763,477 B2 | 7/2010 | Yuan et al. |
| 8,198,645 B2 | 6/2012 | Sakai |
| 8,384,089 B2 | 2/2013 | Sato |
| 2006/0202216 A1 | 9/2006 | Itonaga |
| 2008/0093612 A1 | 4/2008 | Konno et al. |
| 2010/0155693 A1 | 6/2010 | Seo |
| 2011/0240958 A1 | 10/2011 | Jung |
| 2012/0018734 A1 | 1/2012 | Chae et al. |
| 2012/0018853 A1 | 1/2012 | Tamboli et al. |
| 2013/0082290 A1 | 4/2013 | Yan et al. |
| 2013/0130180 A1 | 5/2013 | Pham et al. |

FOREIGN PATENT DOCUMENTS

| | | |
|---|---|---|
| EP | 1345275 | 9/2003 |
| EP | 2372790 | 10/2011 |
| EP | 2597687 | 5/2013 |
| JP | 2002-083796 | 3/2002 |
| JP | 2005-136002 | 5/2005 |
| JP | 2006-060200 | 3/2006 |
| JP | 2008-529271 | 7/2008 |
| JP | 2009-252860 | 10/2009 |
| JP | 2010-153814 | 7/2010 |
| JP | 2010-219310 | 9/2010 |
| KR | 10-2007-0000884 A | 1/2007 |

OTHER PUBLICATIONS

JP Office Action, Application 2015-514636, LUM reference 2012P00451WOJP, dated Jan. 31, 2017, 14 pps.

Mileham et al., "Patterning of AlN, InN, and GaN in KOH-based Solutions", 1996 American Vacuum Society, accepted Oct. 30, 1995, pp. 836-839.

TW Office Action, Application 102119462, LUM reference 2012P00451TW, dated Nov. 23, 2016, 12 pps.

CN Office Action, Application 201380028774.9, LUM reference 2012P00451 WOCN, dated Aug. 24, 2016, 19 pps.

EPO as ISA, International Search Report and Written Opinion dated Oct. 15, 2013 from International Application No. PCT/182013/054224 filed May 22, 2013, 15 pages.

Yang et al., "Micromachining of GaN Using Photoelectrochemical Etching", PhD Dissertation submitted to University of Notre Dame, (Apr. 2005).

EPO Office Action dated Feb. 15, 2017, European Application No. 13734503.9, 7 pages.

Second Office Action dated May 3, 2017, China Patent Application No. 201380028774.9, 7 pages.

Notice of Reason for Rejection dated Sep. 19, 2017, Japan Application No. 2015-514636, 4 pages.

Office Action dated Mar. 20, 2018, Japanese Patent Application No. 2015-514636, 6 pages.

LIGHT EXTRACTION USING FEATURE SIZE AND SHAPE CONTROL IN LED SURFACE ROUGHENING

CROSS-REFERENCE TO RELATED APPLICATIONS

This application is a continuation of U.S. application Ser. No. 15/216,444, filed on Jul. 21, 2016, which is a divisional of U.S. application Ser. No. 14/402,362, filed on Nov. 20, 2014, which is a 371 (c) national stage entry of International Application No. PCT/IB2013/054224, filed on May 22, 2013, which claims the benefit of U.S. Provisional Patent Application No. 61/654,112, filed on Jun. 1, 2012. U.S. application Ser. No. 15/216,444, U.S. application Ser. No. 14/402,362, International Application No. PCT/IB2013/054224, and U.S. Provisional Application No. 61/654,112 are incorporated herein by reference.

FIELD OF THE INVENTION

This invention relates to the field of semiconductor light emitting devices (LEDs), and in particular to a method for enhancing the light extraction efficiency from the surface of the LED.

BACKGROUND OF THE INVENTION

Light emitting devices generally comprise an active light-emitting layer sandwiched between an n-type and p-type semiconductor layer, with the generated light being emitted through one of these semiconductor layers. When the light strikes the light-exit surface of the semiconductor surface, however, some of the light is reflected back toward the active layer due to the difference of refractive indexes between the light-exit surface and the air or other medium through which the light is emitted ('internal reflection'). Some portion of the reflected light may subsequently be able to exit the light-exit surface, but some portion will be absorbed in the materials within the light emitting device.

To reduce the amount of light that is internally reflected, thereby increasing the amount of light that is extracted from the light emitting device, the light-exit surface is purposely roughened. The non-planar surface increases the likelihood that the light from the active layer, which is propagated in a variety of directions from the active layer, will strike some feature of the roughened surface that allows the light to escape from the surface.

FIGS. 1A-1D illustrate a conventional process for creating a light emitting device 100 with increased light extraction efficiency.

FIG. 1A illustrates creation of the semiconductor device on a growth substrate 110. An n-type layer 120 is grown on the growth substrate 110, followed by an active layer 130, and a p-type layer 140. Contact pads 150 are provided for external contact to the n-type and p-type layers; insulating and internal components to provide this coupling are not shown, for ease of illustration. In like manner, the layers 120, 130, 140 may comprise multiple layers of materials, and other layers or vias may also be present. In an alternative arrangement, a p-type layer 140 may be grown on the substrate 110, followed by active layer 130 and n-type layer 120.

Because the contact pads 150 are typically opaque, the light emitted from the active layer 130 is extracted from the surface opposite the contact pads 150. If the growth substrate 110 is transparent it may be left intact. Otherwise in order to avoid absorption of the emitted light or to add additional scattering to the structure, the growth substrate 110 is removed to form a thin film device, and the light is emitted from the n-type layer 120. FIG. 1B illustrates the conventional orientation of an illustration of a light emitting device 100 after removal of the substrate 110, with the contact pads 150 on the 'bottom' of the device 100 and the light-exiting layer 120 on the 'top' of the device 100, commonly known in the art as a "Flip-Chip" embodiment.

As noted above, to increase the amount of light that is able to escape from the light-exiting surface 125 of layer 120 compared to the amount of light that is internally reflected and absorbed (the 'light extraction efficiency'), the light emitting surface 125 is roughened. A number of techniques are available for roughening the surface 125, two common techniques being photo-electrochemical (PEC) wet etching and photochemical (PC) wet etching.

As described in MICROMACHINING OF GaN USING HOTOELECTROCHEMICAL ETCHING, A PhD Dissertation submitted to the Graduate School of the University of Notre Dame, by Bo Yang, Patrick Fay, Director, Graduate Program in Electrical Engineering, April 2005, the light from a high intensity source is absorbed in the semiconductor layers near or at the semiconductor-electrolyte interface. The holes that are generated drift under the influence of valence band bending towards the interface. There the holes represent broken crystal bonds and enable etching that would not occur without illumination. The roughness of the etch results from the uneven distribution of holes on the surface, leading to an uneven local etch rate. The material properties affect the etching results significantly. For example, as described in Section 2.3.5 and references therein, the density of topographical features is directly related to the dislocation density in the material. Layers of higher defect potential such as AlGaN compared to GaN will have a higher density of features. As a second example, by filtering the spectrum of the high intensity source, the relative etch rates of two materials of different handclap may be modified. Finally, by adjusting the light intensity and molarity, the relative etch rates of layers of different defect density may be affected.

FIG. 1C provides a conceptual illustration of the result of a roughening process on the light-exiting surface 125 of a light emitting device 100, and FIG. 1D provides an image of an actual surface of a conventional LED that has been roughened by PEC etching. As illustrated, the roughening process produces a fairly random three-dimensional topology, the topology being dependent upon the composition of the material of the layer 120 being etched as well as the parameters of the roughening process, such as the concentration and type of etchants used, the temperature and duration of etching, applied electrical bias and so on. Conventionally, different sets of etching process parameters are tested with the particular material to be etched to determine the set that provides the best light extraction efficiency for that material. The determined best set is subsequently used for producing LEDs that use this material.

SUMMARY OF THE INVENTION

It would be advantageous to further increase the light-extraction efficiency of light emitting devices. It would also be advantageous to further increase the light-extraction efficiency via roughening processes that are common in the art.

To better address one or more of these concerns, in an embodiment of this invention, the structural characteristics of the light-exiting surface of a light emitting device are controlled so as to increase the light extraction efficiency of that surface when the surface is roughened. A light emitting surface comprising layers of materials with different durability to the roughening process has been found to exhibit a higher light extraction efficiency than a substantially uniform light emitting surface exposed to the same roughening process. In a GaN-type light emitting device, a thin layer of AlGaN material on or near the light-exiting surface creates more distinct features after etching compared to the features created by conventional etching of a surface comprising only GaN material.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions. The drawings are included for illustrative purposes and are not intended to limit the scope of the invention.

DETAILED DESCRIPTION

Figure 1A:
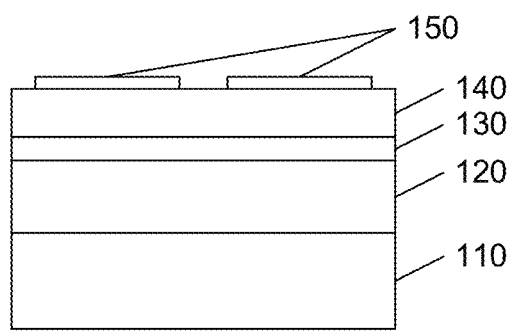
FIGS. 1A-1D illustrate an example conventional process for creating a light emitting device with a roughened surface that enhances light extraction efficiency.
Figure 1B:
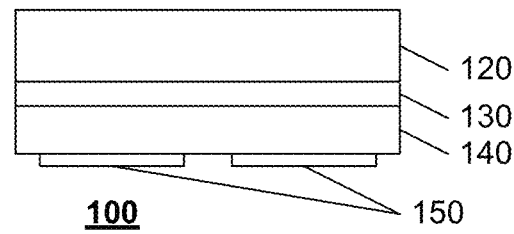

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

For ease of illustration and understanding, this invention is presented in the context of a light emitting device comprising GaN semiconductor layers, although one of skill in the art will clearly recognize in view of this disclosure that the principles of this invention are not limited to the use of GaN semiconductors. In like manner, the invention is presented in the context of a flip-chip light emitting device, and one of skill in the art will clearly recognize that the principles of this invention are not dependent on flip-chips, and are not necessarily dependent upon the use of semiconductor light emitters as the light source, although the invention is particularly well suited for creating semiconductor light emitting devices with high light extraction efficiency. That is, any application that relies on improving light extraction efficiency by roughening a light-exiting surface may benefit through the use of the principles presented herein, the degree of benefit being dependent upon the nature of the light being emitted by the light source, such as the wavelength, degree of collimation, and the composition of the light-exiting surface.

FIGS. 2A-2D illustrate an example process for creating a light emitting device 200 with a composition of a roughened epitaxial surface that further enhances light extraction efficiency compared to the light extraction efficiency of the conventional light emitting device 100 of FIGS. 1A-1D.

In embodiments of this invention, surface that is roughened includes a mix of materials having material characteristics that react differently to the roughening process. The characteristics may include, for example, the material composition (stoichiometry), crystal defect density, type of crystal defects, carrier concentration, epitaxial stress, and so on. These characteristics may be varied by controlling the deposition conditions. For example, defect density increases as the growth temperature is reduced below optimum as described in "Organometallic Vapor-Phase Epitaxy, Second Edition: Theory and Practice" by G. B. Stringfellow. The effects of the layer properties on the resultant topology will generally be dependent upon the parameters of the etching or other roughening process.

Figure 2A:
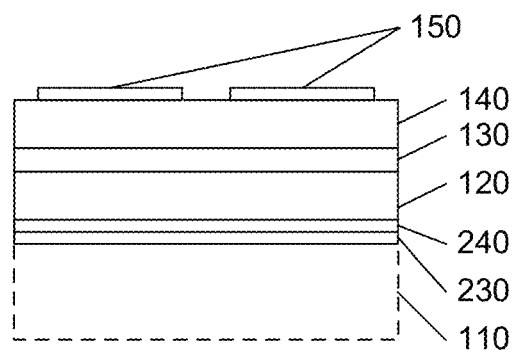
FIGS. 2A-2D illustrate an example process for creating a light emitting device with a composition of a roughened surface that further enhances light extraction efficiency.
Figure 2B:
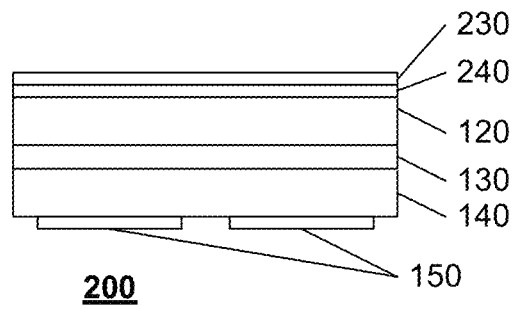
Figure 2C:
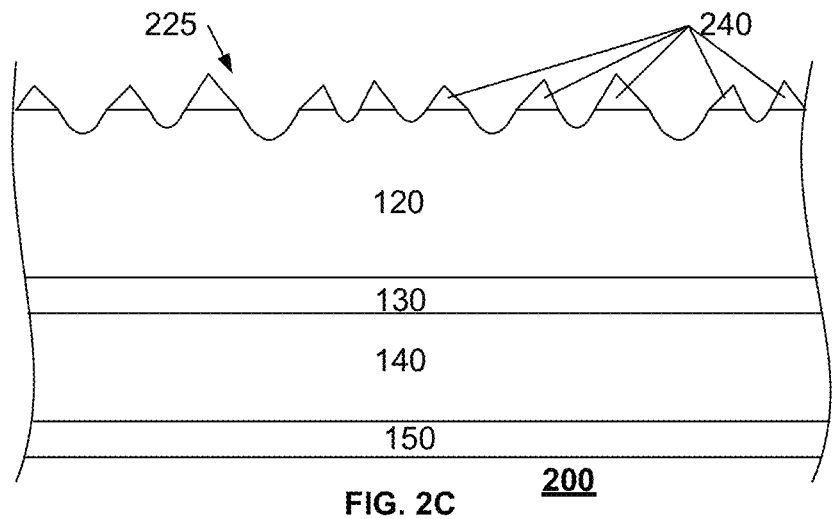

In the example light emitting device 200, an epitaxial 'template' layer 240 provides the surface upon which the light emitting stack (the n-type layer 120, the active layer 130, and the p-type layer 140) is grown. The epitaxial layer 240 is added so as to provide different etching characteristics than the characteristics of n-type layer 120, as detailed further below. Depending upon the particular technology used to form/grow the device 200, a thin 'starter' layer 230, sometimes called the growth initiation layer, may be grown on the substrate 110 to provide an appropriate seeding film for initiating epitaxial growth on the substrate 110. After the substrate 110 is removed, as illustrated in FIG. 2B, the device 200 is subjected to a roughening process, which may include a conventional KOH-based PEC etch. As with the conventional etching of a light-emitting surface, determination of the etching recipe to achieve optimal roughening generally requires testing multiple sets of etching process parameters. The optimal etching parameters will depend upon the particular wavelength of emitted light and the particular materials used to form the epitaxial layer 240 and n-type layer 120. In the example device 200, the etching process parameters are such that the etching extends through portions of the epitaxial layer 240 and into the n-type layer 120, as illustrated in FIG. 2C.

In the example of a GaN light emitting device, the epitaxial layer 240 includes a thin layer of $Al_xGa_{1-x}N$, where x is the fractional amount of Al in the layer relative to the amount of Ga. Because of the different compositions of the epitaxial layer (AlGaN) 240 and the n-type layer (GaN) 120, the etching process will have different effects on these layers 240,120.

Figure 1C:
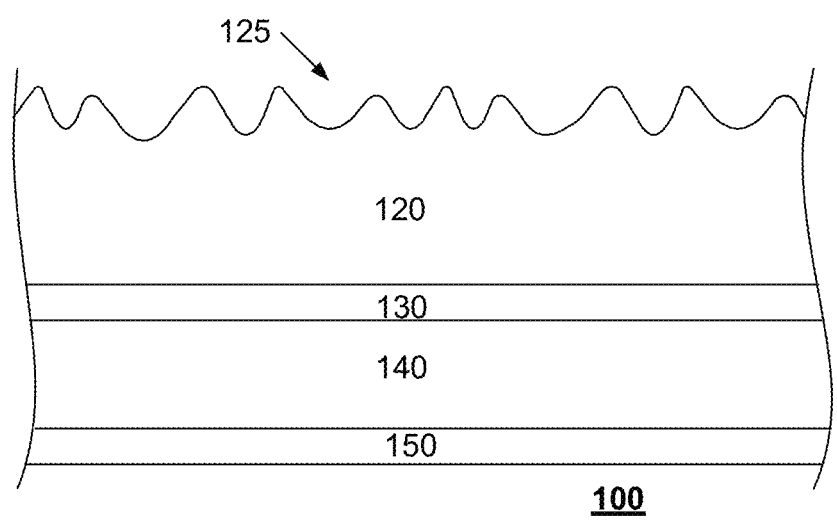
Figure 1D:
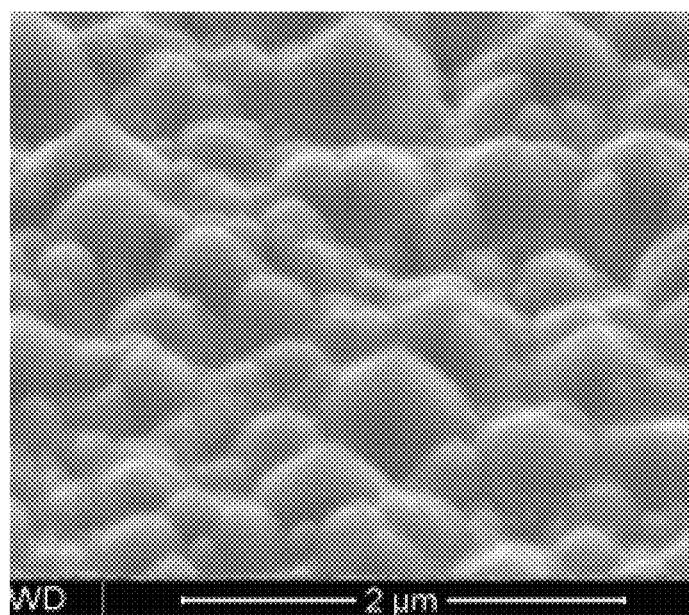

Returning to the example of FIGS. 1C and 1D, the conventional etching of a GaN surface results in a topology with relatively flat peaks on most of the features. That is, as the etching extends down to form "valleys" between the "hills", the edges and tops of these hills are also being worn down by the etching.

Contrarily, the etching of AlGaN will generally produce a topology with sharper edges, due to the presence of Al in the structure. Additionally, once the etching extends into the less durable GaN layer, the time required to etch the GaN layer may not be long enough to wear down the edges and tops of the AlGaN peaks. For the purposes of this disclosure, a first topology is 'sharper' than a second topology if the features of the first topology exhibit more points or edges than the features in the second topology, or exhibit fewer curved surfaces in profile than the features in the second topology. Additionally, the size and mutual separation of the rough features can be modulated by controlling the composition and growth conditions for the epitaxial AlGaN layer 240.

FIG. 2C provides a conceptual illustration of the results of etching a two-layer structure wherein the first layer 240 being etched is more durable to the etching process than the second layer 120. If the optional starter layer 230 had been used, a wet etching process or another suitable process, such as dry etching, may be used to remove it. More generally, a dry etch step may be used to place the starting point for the PEC etching at the most advantageous position. A timed or endpointed dry etch using industry standard dry etch equipment may be used to precisely create the starting point for the PEC etching. For an example AlN/AlGaN/GaN layer stack created when AlN is used as the starter layer 230, a chlorine-containing plasma (dry) etch chemistry, such as $Cl_2$, $BCl_3$ or a mixture thereof, may be used to accomplish this purpose. Inert gases such as argon or helium may be added to the plasma chemistry to control the etch process precisely and improve etch process performance metrics such as etch rates, selectivity and uniformity. Additional process parameters for controlling the dry etch process include pressure, flow rates and ratios for the constituent gases, microwave or radio frequency power input or inputs into the dry etch chamber, wafer or package temperature and chamber hardware components such as ceramic or conducting shields and uniformity-improving rings.

As illustrated, the upper tips of the surface 225 of the topological structure of FIG. 2C (and example FIG. 2D) of the device 200 after etching exhibit a roughened geometry in the epitaxial layer 240 that is significantly 'sharper' than the upper tips of the topology of device 100 in FIG. 1C (and example 1D). Also as illustrated in FIG. 1C, the topology of the features formed at the epitaxial layer 240 is substantially sharper than the topology of the features formed in the N-type layer 120. That is, in profile, the shape of upper tips of the features (hills), formed in the epitaxial layer 240 is substantially less curved than the shape of the features (valleys) formed in the N-type layer 120. The size of these rough features plays a significant role in the extraction efficiency because the latter varies with the wavelength of emitted light for a given feature geometry and size. The addition of the epitaxial layer 240 allows feature size tuning to make the rough surface optimal for high light extraction efficiency over a wide range of wavelengths.

The taper angle and feature size in the roughened surface 225 will be dependent upon the fractional ratio of Al in the $Al_xGa_{1-x}N$ layer 240, as well as the material quality in the epitaxial layer 240. A fractional ratio (x) of Al between 0.3 and 0.8, and in some embodiments, between 0.5 and 0.7, will be effective for providing sharper and more densely packed features, and correspondingly increasing the light extraction efficiency.

The refractive index of the AlGaN layer 240 is lower than the refractive index of the GaN layer 120; to avoid internal reflection, the thickness of the AlGaN may be less than 50 nm. Or the dry etch step may be used to removal all but 50 nm or less of the AlGaN layer 240 prior to the PEC etch.

Figure 2D:
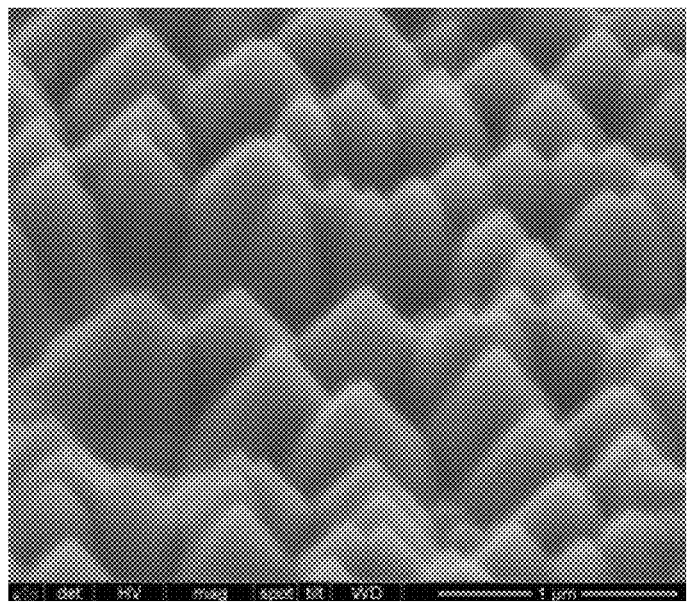

FIG. 2D illustrates an image of an actual surface after a KOH-PEC etching of the surface of a device comprising an $Al_{0.6}Ga_{0.4}N$ epitaxial layer over a conventional GaN n-type layer. As contrast to the image of FIG. 1D, it is clear that the peaks of each of the features/hills are sharper and more pronounced. The presence of Al in the epitaxial layer (AlGaN) makes the taper angle of the rough features sharper, reducing the flatness of the rough surface compared with the conventional GaN roughness illustrated in FIG. 1D. This sharpening of rough features more efficiently couples light out of the LED chip, providing an increase in light extraction efficiency.

Figure 3:
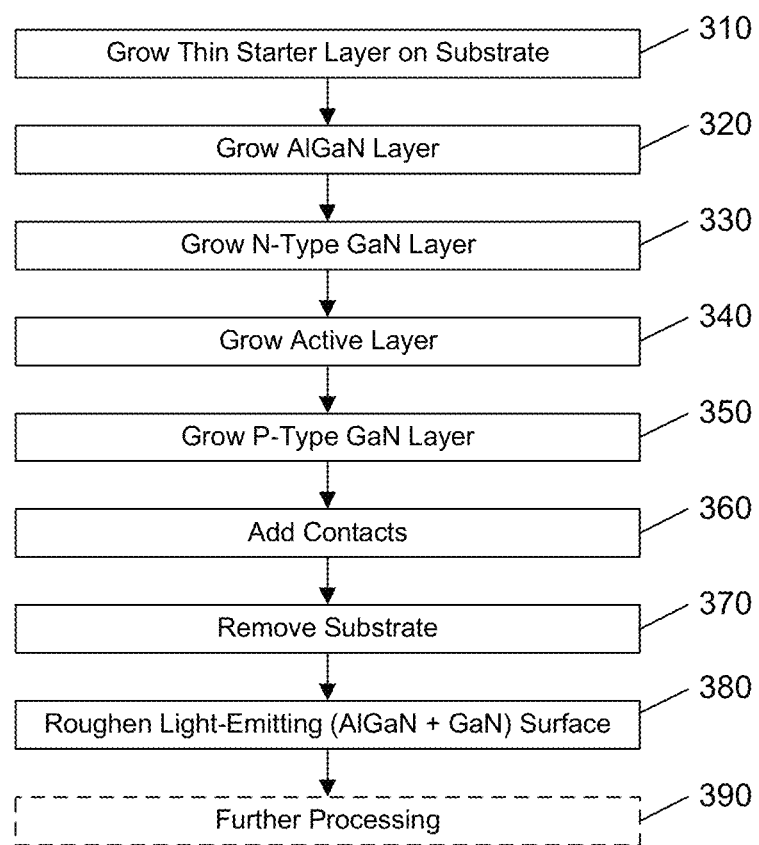
FIG. 3 illustrates an example flow diagram for producing a light emitting device with a composition of a roughened surface that further enhances light extraction efficiency.

FIG. 3 illustrates an example flow diagram for producing a light emitting device with a roughened surface that provides increased light extraction efficiency. In this example, the semiconductor material of the light emitting device is assumed to be GaN, although one of skill in the art will recognize that the principles presented herein will be applicable for a variety of materials.

Optionally, at 310, a thin starter layer of GaN or AlGaN or AlN may be formed on a growth substrate. If Si is the growth substrate for example, an AlN layer will be formed to isolate the substrate and control strain.

At 320, the AlGaN layer is formed, preferably at a thickness of less than 500 nm.

At 330-350, the light emitting device is formed, using conventional techniques. At 330, the N-type GaN layer is formed; at 340, the active layer is formed; and at 340, the P-type GaN layer if formed.

Contact pads are formed during the device fabrication process, commonly known in the art as "wafer fab", at 360, to facilitate external coupling to the N and P type layers. Insulated vias may be used to couple the N-type layer through the active layer and the P-type layer, so that both contact pads are on the same surface of the device, opposite the light emitting surface, which will be, in this example, the surface of the AlGaN layer. These contact pads facilitate mounting the device on a printed circuit board or lighting fixture in a 'flip-chip' configuration.

The growth substrate is removed, at 370, and the exposed surface is roughened, at 380. The roughening may consist of a one-step process of PEC etching and may remove the optional starter layer, and extend through the AlGaN layer and into the N-type GaN layer. Alternatively, a multi-step process, combining dry etch and wet etch processes may be used to remove undesired layers, such as the initial AlN, stopping on the layer in the structure where the second etch step, PEC etch, will provide the most distinct features.

The device may be further processed, at 390, including, for example, formation of a wavelength conversion (phosphor) layer upon the roughened surface and/or encapsulating the light emitting device with a transparent material, such as a glass or epoxy dome.

While the invention has been illustrated and described in detail in the drawings and foregoing description, such illustration and description are to be considered illustrative or exemplary and not restrictive; the invention is not limited to the disclosed embodiments. For example, it is possible to operate the invention in an embodiment known in the art as "Vertical Thin Film" LED wherein the n contact to the LED device is made on the roughened side. The re-contact may be produced either prior to or after the roughening step in the process flow.

Additionally, because the increased light extraction efficiency is the result of different roughened topologies, caused by the use of layers of differing durability to the roughening process, the principles of this invention are not limited to the use of only two layers of different durability, nor are they limited to a particular arrangement of the different layers.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Any reference signs in the claims should not be construed as limiting the scope.

The invention claimed is:

1. A light emitting device, comprising:
   a light emitting structure, comprising:
      a light extraction surface, comprising:
         a first conductive layer comprising $Al_xGa1-xN$ with x between 0.2 and 0.8;
         a second conductive layer comprising $Al_xGa1-xN$ with x between 0 and 0.2; and
         peaks in the first conductive layer of the light extraction surface and valleys in the second conductive layer of the light extraction surface, such that the peaks in the first conductive layer are sharper than the features at valleys in the second conductive layer;
      an active layer; and
      an N-type contact and a P-type contact on a same surface opposite the light extraction surface.

2. The device of claim 1, wherein the features peaks and the valleys are etched via a photo-electrochemical (PEC) wet etching technique.

3. The device of claim 1, wherein the peaks and the valleys are etched via a multi-step process comprising a dry etch and a wet etch process.

4. The device of claim 1, further comprising a wavelength converting layer.

5. The device of claim 4, wherein the wavelength converting layer is formed on a roughened surface.

6. A light emitting device, comprising:
   a light emitting structure, comprising:
      a light extraction surface, comprising:
         a first conductive layer comprising $InAl_xGa1-xP$ with x between 0.5 and 1.0;
         a second conductive layer comprising $InAl_xGa1-xP$ with x between 0 and 0.4; and
         peaks in the first conductive layer of the light extraction surface and valleys in the second conductive layer of the light extraction surface, such that the peaks in the first conductive layer are sharper than the valleys in the second conductive layer;
      an active layer; and
      an N-type contact and a P-type contact on a same surface opposite the light extraction surface.

7. The device of claim 6, wherein the peaks and the valleys are etched via a photo-electrochemical (PEC) wet etching technique.

8. The device of claim 6, wherein the peaks and the valleys are etched via a multi-step process comprising a dry etch and a wet etch process.

9. The device of claim 6, further comprising a wavelength converting layer.

10. The device of claim 9, wherein the wavelength converting layer is formed on a roughened surface.

* * * * *